US006949386B2

(12) United States Patent
Piguet et al.

(10) Patent No.: US 6,949,386 B2
(45) Date of Patent: Sep. 27, 2005

(54) METHOD FOR MASS PRODUCTION OF A PLURALITY OF MAGNETIC SENSORS

(75) Inventors: Dominique Piguet, Lausanne (CH); Franck Vincent, Apples (CH)

(73) Assignee: Asulab S.A., Marin (CN)

( * ) Notice: Subject to any disclaimer, the term of this patent is extended or adjusted under 35 U.S.C. 154(b) by 0 days.

(21) Appl. No.: 10/480,271

(22) PCT Filed: May 22, 2002

(86) PCT No.: PCT/EP02/05753

§ 371 (c)(1), (2), (4) Date: Sep. 14, 2004

(87) PCT Pub. No.: WO02/101845

PCT Pub. Date: Dec. 19, 2002

(65) Prior Publication Data

US 2005/0124136 A1 Jun. 9, 2005

(30) Foreign Application Priority Data

Jun. 12, 2001 (EP) ................................. 01202262

(51) Int. Cl.[7] ........................ H01L 21/00; H01L 21/30; H01L 21/46

(52) U.S. Cl. ........................... 438/3; 438/455; 438/458

(58) Field of Search ............................ 438/3, 199, 455, 438/458; 428/692; 324/244, 260

(56) References Cited

U.S. PATENT DOCUMENTS 6,437,558 B2 * 8/2002 Li et al. ..................... 324/174
6,809,516 B1 * 10/2004 Li et al. ..................... 324/260
2001/0040450 A1 * 11/2001 Li et al. ..................... 324/260
2002/0039263 A1 * 4/2002 Inaguma ..................... 360/322
2002/0090755 A1 * 7/2002 Matsuzaki et al. .......... 438/108
2004/0004261 A1 * 1/2004 Takahashi et al. .......... 257/414
2004/0131887 A1 * 7/2004 Ao et al. .................... 428/692
2005/0042478 A1 * 2/2005 Okuno et al. ........ 428/694 TM

FOREIGN PATENT DOCUMENTS

EP 1 052 519 A1 11/2000
JP 9-214017 8/1997

OTHER PUBLICATIONS

Chiesi, Laurent, "Planar 2D Fluxgate Magnetometer for CMOS Electronic Compass," Series in Microsystems, vol. 4, Hartung-Gorre Vertag. pp. 48-51.
Blanchard, Hubert, "Hall Sensors with Integrated Magnetic Flux Concentrators," Series in Microsystems, vol. 5, Hartung-Gorre Verlag, pp. 74-77.

(Continued)

*Primary Examiner*—Alexander Ghyka
(74) *Attorney, Agent, or Firm*—Griffin & Szipl, P.C.

(57) ABSTRACT

The present invention relates to a method for producing in large numbers a multiplicity of magnetic sensors produced on a semiconductor substrate, these sensors comprising at least one magnetic core produced in an amorphous magnetic material, characterised in that, after integration of the electronic circuits associated with the magnetic sensors, a film of amorphous magnetic material is glued onto the semiconductor substrate, this film being obtained from a band of amorphous magnetic material cut into a plurality of sections which are disposed one beside the other on a support, said film being then structured in order to form the magnetic cores of said magnetic sensors, the semiconductor substrate being finally cut up in order to provide a plurality of individual magnetic sensors.

30 Claims, 5 Drawing Sheets

OTHER PUBLICATIONS

L. Chiesi et al., "CMOS planar 2D micro-fluxgate sensor," EPFL, Swiss Federal Institute of Technology, Institute of Microsystems, Lausanne, Switzerland, Nov., 1999.
H. Blanchard et al., "Cylindrical Hall Device," EPFL Swiss Federal Institute of Technology, Institute of Microsystems, Lausanne, Switzerland & Sentron AG, Zug, Switzerland.
M. Schneider et al., "High Sensitivity CMOS MicroFluxgate Sensor," Phys. Elec. Lab., Zurich, Switzerland & Dept. of Info. & Comp. Sciences, Toyohashi Univ., Toyohashi, Japan.
H. Blanchard, "Hall Sensors with Integrated Magnetic Flux Concentrators," Hartung-Gorre Verlag Konstanz, 1999.
Search Report for PCT/EP02/05753 in French, dated Apr. 8, 2003.

* cited by examiner

METHOD FOR MASS PRODUCTION OF A PLURALITY OF MAGNETIC SENSORS

This is a National Phase Application in the United States of International Patent Application No. PCT/EP02/05753 filed May 22, 2002, which claims priority on European Patent Application No. 01202262.0, filed Jun. 12, 2001. The entire disclosures of the above patent applications are hereby incorporated by reference.

FIELD OF THE INVENTION

The present invention relates to a method of producing in large numbers a multiplicity of magnetic sensors. It relates in particular, but not exclusively, to magnetic sensors of the type described in the patent application EP 1 052 519 in the name of the applicant.

BACKGROUND OF THE INVENTION

A magnetic sensor of the above-mentioned type is represented in perspective and exploded in FIG. 1 which is appended to the present patent application. Designated overall by the general numerical reference 1, this magnetic sensor is mounted on the surface 2 of a semiconductor substrate 4 of a substantially parallelepiped shape. An electronic circuit (not shown) associated with the magnetic sensor is produced by CMOS integration on the large upper surface 2 of the semiconductor substrate 4.

The magnetic sensor 1 comprises a flat excitation coil 6 which is formed in a metallic layer applied to the face 2 of the substrate 4 in the course of the CMOS integration process. The coil 6 has an exterior perimeter formed by its external wrap 60 of a substantially square shape. The other wraps 62 to 68 of this excitation coil 6 are disposed in a concentric manner with respect to the external wrap 60. Likewise of a square shape, the wraps 62 to 68 are of progressively decreasing dimensions, as is visible in FIG. 1.

A ferromagnetic core 8 is mounted, typically by gluing, above the excitation coil 6. This ferromagnetic core 8 is produced from a band of amorphous magnetic material which is currently available commercially.

As can be seen in FIG. 1, the magnetic core 8 has the shape of a cross which coincides with the two diagonals of the square defined by the external wrap 60 of the excitation coil 6. One can therefore measure two perpendicular components $H_1$ and $H_2$ of the external magnetic field $H_{EXT}$, these two components being respectively directed according to the orthogonal branches 80 and 82 of the core 8. The component $H_1$ of the external magnetic field $H_{EXT}$ is thus measured by the branch 80 of the core 8, whilst the component $H_2$ is measured by its perpendicular branch 82.

The detection of the external magnetic field $H_{EXT}$ is accomplished by means of two pairs of coplanar detection coils 10, 12 and 14, 16. The two first coils 10 and 12, applied by CMOS technology on the upper surface 2 of the semiconductor substrate 4, are mounted in series according to a differential arrangement. Disposed under the flat excitation coil 6 or in the same plane as the latter, these two coils 10 and 12 are each positioned facing one of the free ends of the branch 80 of the ferromagnetic core 8. This first pair of coils 10, 12 has therefore the role of detecting the component $H_1$ of the exterior magnetic field $H_{EXT}$.

The two other detector coils 14 and 16 are identical to the two coils 10 and 12 described previously. Likewise mounted in series according to a differential arrangement, these two detector coils 14, 16 are each disposed facing one of the free ends of the second branch 82 of the ferromagnetic core 8. This second pair of coils 14, 16 has therefore the role of detecting the component $H_2$ of the exterior magnetic field $H_{EXT}$.

The magnetic sensors of the above-described type are in particular intended for equipping magnetometers for detecting, in a plane parallel to the plane of the detection coils, magnetic fields of low to very low value, for example for medical applications. These magnetometers are therefore produced preferably according to CMOS integration techniques, their associated electronic circuits being integrated in the substrate on which the sensors are produced.

The production of such devices for detection and measurement of magnetic fields poses a great problem which, as far as the applicant knows, has not to this day been resolved in a satisfactory fashion. In fact, the electronic circuits associated with magnetic sensors are produced by CMOS technology which comprises a collection of steps for designing and producing electronic components which, today, are remarkably well mastered and allow reliable and cheap devices to be produced in large numbers.

On the other hand, things are different with the production of magnetic sensors associated with the electronic circuits mentioned above. As described above, these magnetic sensors comprise in particular an amorphous ferromagnetic core. Now, none of the currently available techniques for producing semiconductor devices allows components with an amorphous structure to be produced. Amongst these techniques, there can be cited in particular vapour phase deposition, better known with its Anglo-Saxon title “chemical vapour deposition” (CVD), which comprises evaporating in a vacuum a metal which is sublimated by heating in order to form, for example, an oxide or nitride layer with a chemical reaction produced by an appropriate gas. Another technique, known by the title of electro-deposition or galvanoplasty, comprises forming a metallic layer on an item by electrolysis and applies to dissolved or molten compounds which are dissociable into two types of ions ensuring the passage of the current by their displacement, the positive ions being directed towards the cathode and the negative ions towards the anode.

Hence, the techniques for producing CMOS integrated circuits only allow production of components with an ordered crystalline structure, and they are unable to propose replacement solutions for developing bodies with an amorphous structure, i.e. not having a crystal lattice. In any case, certain techniques are known which allow a layer of amorphous material to be deposited on the surface of a substrate. These techniques only permit however deposition of materials which have a simple chemical composition formed by a single component. For more complex products, like a magnetic material which comprises a plurality of components, nothing has been able to be proposed.

The technique reserved by the applicant for producing magnetic sensors, such as described in the patent application EP 1 052 519 mentioned above, comprises therefore producing firstly, on a semiconductor board, a series of electronic circuits, then sawing this board in order to provide a plurality of individual electronic circuits, and finally gluing on these individual circuits bands of amorphous magnetic material which, after photolithography and etching, will form the ferromagnetic cores.

It will be readily understood that such a technique, if it can be used at the experimental stage, is in no way applicable on an industrial scale where very large quantities of components must be able to be produced rapidly and at low cost.

The object of the present invention is to eliminate the disadvantages mentioned above and also others by proposing a method for producing in series and at the same time reliably and cheaply, magnetic sensors, the zone which is sensitive to the external magnetic field of which is produced in an amorphous magnetic material.

SUMMARY OF THE INVENTION

To this end, the present invention relates to a method of producing in large numbers a multiplicity of magnetic sensors produced on a semiconductor substrate, these sensors comprising at least one magnetic core produced in an amorphous magnetic material, characterised in that, after integration of the electronic circuits associated with the magnetic sensors, a film of amorphous magnetic material is glued onto the semiconductor substrate, this film being obtained from a band of amorphous magnetic material cut into a plurality of sections which are disposed one beside the other on a support, said film being then structured in order to form the magnetic cores of said magnetic sensors, the semiconductor substrate being finally cut up in order to provide a plurality of individual magnetic sensors.

Thanks to these features, the present invention provides a method which allows production of all the operations for producing magnetic sensors with amorphous magnetic cores on the board made of semiconductor material, in which the electronic circuits which are intended to be associated with said magnetic sensors are integrated. It is possible in particular, thanks to the present invention, to produce in series the magnetic cores produced in an amorphous magnetic material and to saw the board of semiconductor material only once the magnetic sensors have been entirely completed. Such a method therefore allows simultaneous production of large quantities of magnetic sensors, typically of the order of 3000 sensors or more per semiconductor board of 6 inches, in an extremely reliable manner and at a low cost price. It was realised in particular that the possible misalignment between cores and coils did not exceed a few microns, and that the characteristics of the magnetic sensors showed great uniformity over the same board, and even over a series of boards. These particularly advantageous results are achieved thanks to the fact that, according to the present invention, a film is formed by means of a plurality of bands of an amorphous magnetic material, such as is commercially available, disposed one beside the other on a support, this film then being glued onto the board of semiconductor material then structured in order to form the magnetic cores before the board is finally sawn in order to provide a plurality of individual sensors which are ready for use. Such a technique is of course much more advantageous than the techniques of prior art which comprised, after having integrated the electronic circuits, cutting up the board of semiconductor material then structuring one by one the magnetic cores on the individual circuits.

According to another feature of the invention, the film of amorphous magnetic material is glued in a vacuum on the semiconductor substrate. It is thus ensured that the film will be applied on the semiconductor substrate with a considerable force, which assists adhesion of the film on the substrate and allows the avoidance of air bubbles being trapped under the metallic layer.

According to yet another feature of the invention, the film of amorphous magnetic material is structured by means of engraving techniques which are currently employed in the field of semiconductor component production. Reliable techniques are therefore implemented which allow production of magnetic cores at a low cost price and ensure excellent reproducibility of the features of these cores.

BRIEF DESCRIPTION OF THE DRAWINGS

Other features and advantages of the present invention will emerge more clearly from the detailed description which will follow of an example for the implementation of the method according to the invention, this example being given purely in an illustrative and non-limiting manner, in conjunction with the appended drawings in which.

DETAILED DESCRIPTION OF THE ILLUSTRATIVE EMBODIMENTS

The present invention starts with the general inventive concept which comprises forming a film of amorphous magnetic material by means of a plurality of bands of amorphous magnetic material which are disposed one beside the other on a support and gluing the thus obtained film on a semiconductor board, in which the electronic circuits associated with the magnetic sensors which are intended to be produced have been previously integrated. After this gluing step, the film of amorphous magnetic material is structured by etching in order to form the magnetic cores which form the part of the magnetic sensors sensitive to the exterior magnetic field. Thanks to these features, the problem posed by the techniques currently available for production of semiconductor devices which do not allow production of amorphous layers is resolved, and the production in series of magnetic sensors with amorphous magnetic cores is made possible.

The present invention will be described in conjunction with the magnetic sensor taught by the patent application EP 1 052 519 in the name of the applicant. It goes without saying however that the present invention is in no way limited to such a type of sensor and that it applies in the same manner to all types of magnetic sensors comprising one or more magnetic cores, the shape and the dimensions of which may vary.

The various steps will now be described of a method allowing mounting of ferromagnetic cores, which are produced in an amorphous magnetic material, on the surface of a board made of semiconductor material, such as silicon. The silicon board, also called "wafer" in English, typically has a diameter of 6 inches and integrates circuits of the standard CMOS type on its surface. Of interest in particular will be the steps which it is necessary to implement in order to change a whole silicon board, such as is delivered by a foundry, into integrated circuits still called "chips" in English, which are ready to be mounted on a printed circuit.

The amorphous magnetic material to be used is currently commercially available in the form of bands of a few meters in length, an inch width and 18 μm thickness. The first step comprises thinning these bands by grinding, reducing their thickness from 18 to 11 μm, which allows an improvement also in their surface condition and a reduction in their roughness.

The bands thus obtained are then subjected to gentle etching which dissolves approximately one micron of metal on each of the faces of the bands, which has the effect of eliminating mechanical stresses produced on the surface of the bands by the initial grinding step.

Figure 1:
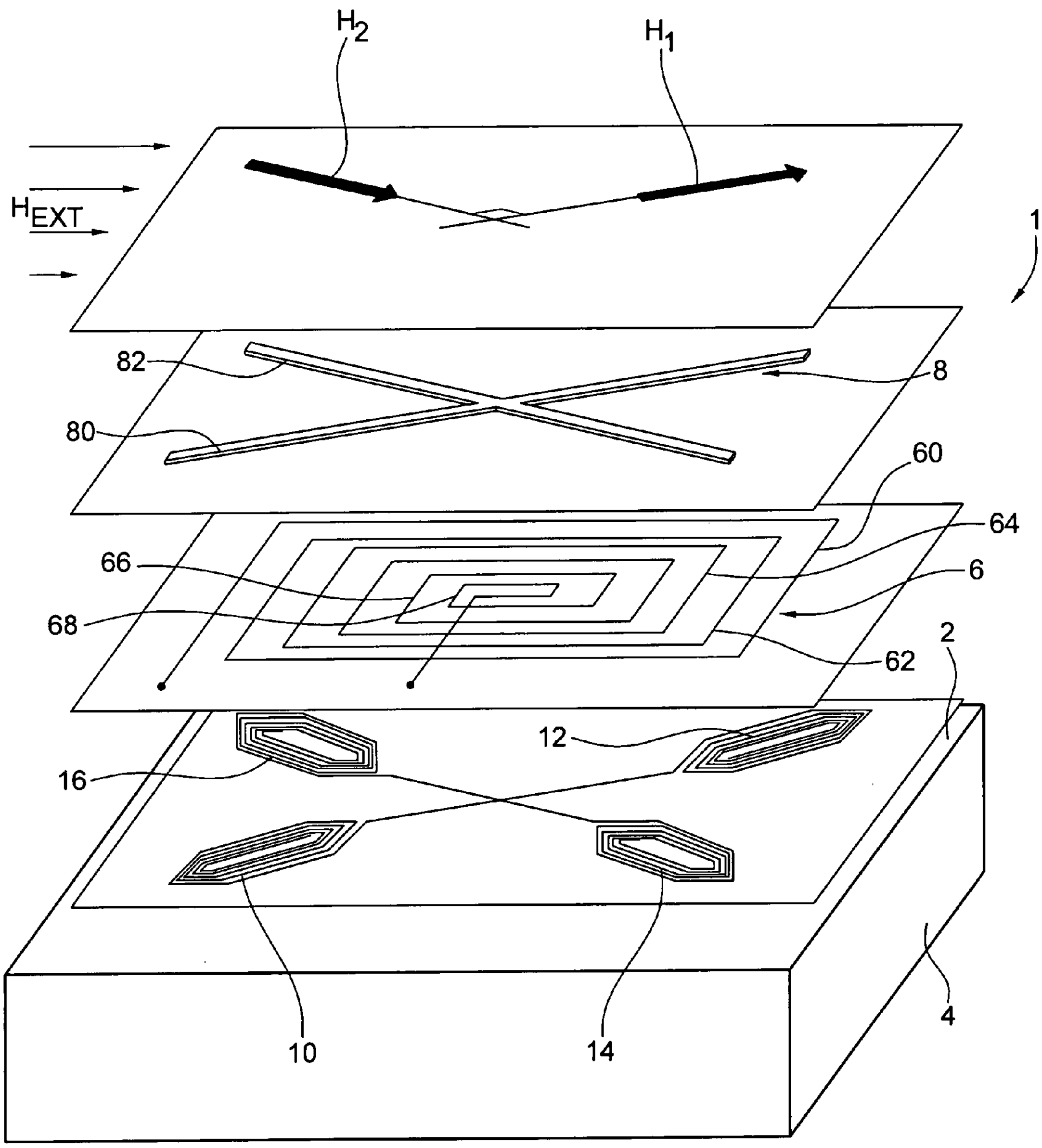
FIG. 1, already cited, is a view in perspective and exploded of a magnetic sensor comprising a core produced in an amorphous magnetic material.
Figure 2:
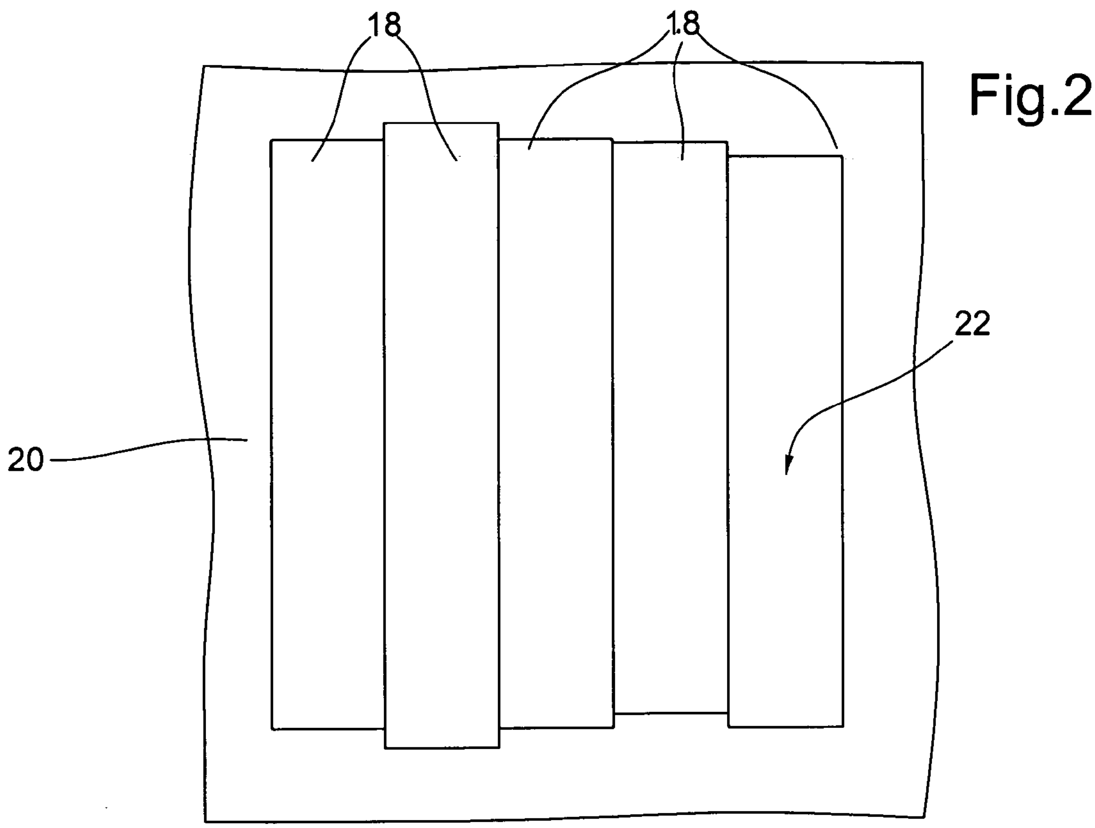
FIG. 2 is a view showing bands of amorphous metal which are cut up and glued on a single face adhesive substrate.

After this initial step for preparing the bands, one of these bands is cut into several pieces 18 which will be glued one beside the other on a single face adhesive support 20 (see FIG. 2), so as to form a surface which covers at least that of the semiconductor substrate 4 on which the pieces 18 of amorphous magnetic material band are intended to be glued.

Figure 3:
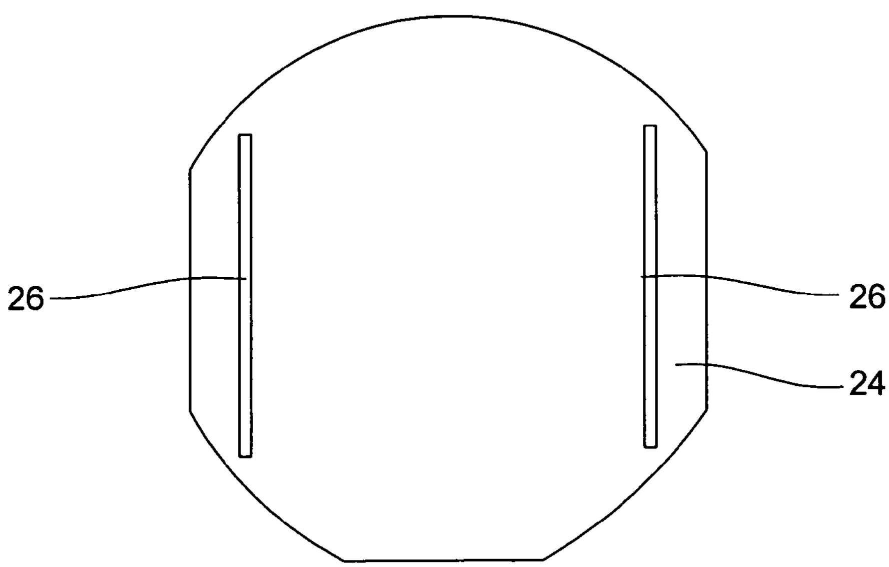
FIG. 3 is a view of an adhesive mask used for carrying out an etching of the metal bands represented in FIG. 1 in order to give these bands the shape of a semiconductor board on which they will be subsequently glued.
Figure 4:
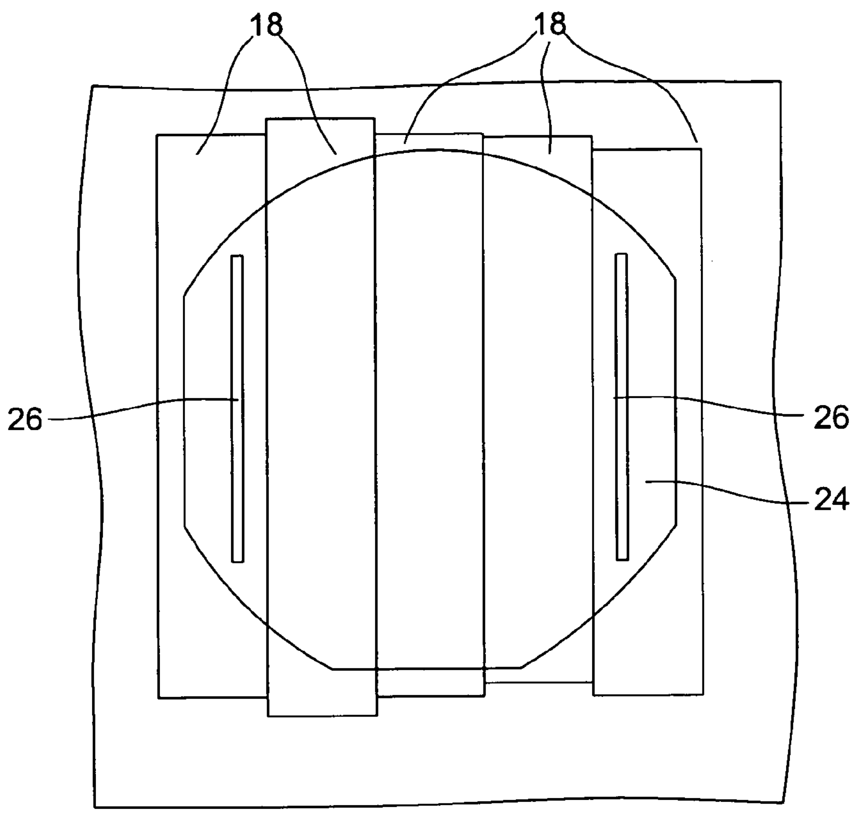
FIG. 4 is a view of the adhesive mask of FIG. 2 glued on the bands of amorphous magnetic material.
Figure 5:
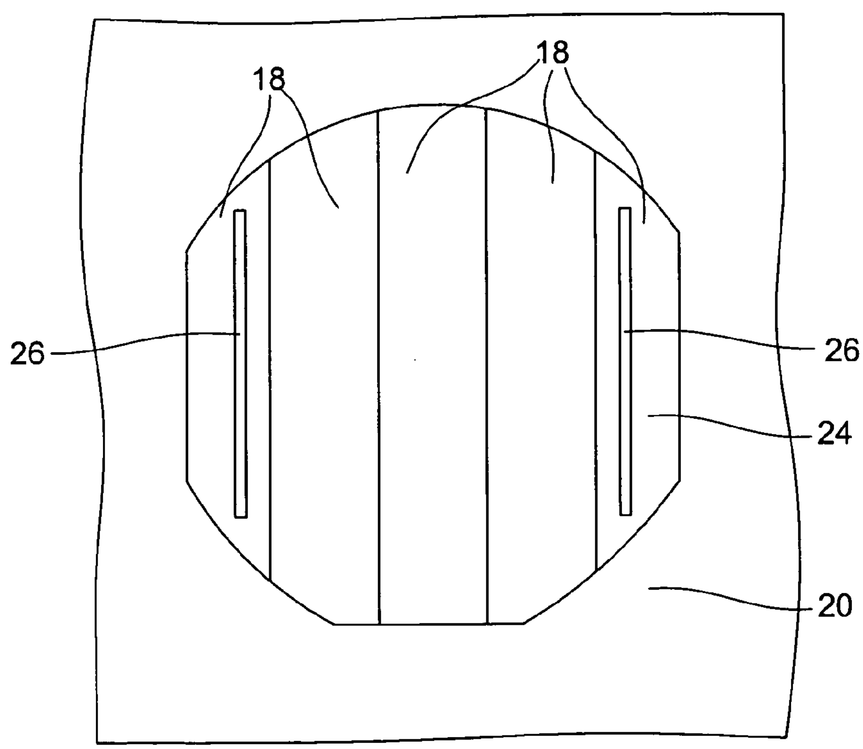
FIG. 5 is a view in which the bands of amorphous metal are represented after the etching.

In order to obtain with the above-mentioned assembly of bands 18 a film of amorphous magnetic material 22, the shape of which coincides with that of the semiconductor substrate 4, an adhesive mask 24 is glued on the film 22 (see FIG. 3) and etching is implemented through this mask 24. Only the zones of the film of amorphous magnetic material 22 which are not protected by the mask 24 will be engraved (see FIGS. 4 and 5). This step likewise allows production in the film 22 of free zones 26 which will subsequently allow visualisation, during the photolithographic step, of alignment references present on the semiconductor substrate 4.

After etching, the adhesive substrate 20 is removed and the bands 18 are cleaned and dried on this non-protected side. The adhesive mask 24 is kept in place in order to be used for protection during the gluing step by limiting possible infiltrations of glue on the surface of the film 22. In order to be able to easily remove the adhesive substrate 20 without risking tearing the bands 18 of amorphous magnetic material, it is necessary that this substrate 20 has a lesser adhesive power than that of the adhesive mask 24.

At this stage of the description, it is important to note that the production of what is called here "film" of amorphous magnetic material 22 by means of pieces of juxtaposed bands 18 of the same material is solely dictated by technical imperatives. In fact, at the current moment commercially, amorphous magnetic bands which have at least a width equal to the diameter of a standard silicon substrate do not exist. One is therefore obliged to revert to the technique described above. Of course, if wider bands came to be available on the market, these would be used for preference because they would allow the step to be avoided which comprises sticking less wide pieces of band on an adhesive support.

Before sticking bands 18 of amorphous magnetic material on the semiconductor board 4, the latter is cleaned in advance, for example by means of acetone then isopropanol, then rinsed twice with demineralised water before being dried in a clean room. The board 14 can then be placed in an oven in order to evaporate the residual humidity which will improve the adhesive power of the glue. The glue 28 used to glue the film of amorphous magnetic material 22 onto the semiconductor board 4 is prepared, then degassed. This may concern a glue of the epoxy type, to which an adhesive promoter, such as for example, silicon microbeads, can be added if necessary.

An appropriate quantity of glue 28 is placed in the centre of the semiconductor board 4 which is then placed on a rotating plate. Then the board 4 is made to rotate at high speed for a specific time, for example 40 seconds at 4000 rpm so that the glue 28 is distributed in a uniform manner by centrifugation over the entirety of the surface of said board 4.

After application of the layer of glue 28, the assembly of bands 18 of amorphous magnetic material, which are supported by the adhesive mask 24, is positioned with respect to the semiconductor board 4 then applied on the large upper surface 2 of the latter by means of a pressure roller or a laminator which allows avoidance of air bubbles being trapped under the metallic layer.

Additionally, a film for supplementary protection, for example made of Mylar®, can be applied on the adhesive mask 24 in the aim of avoiding penetration of the glue.

Figure 6:
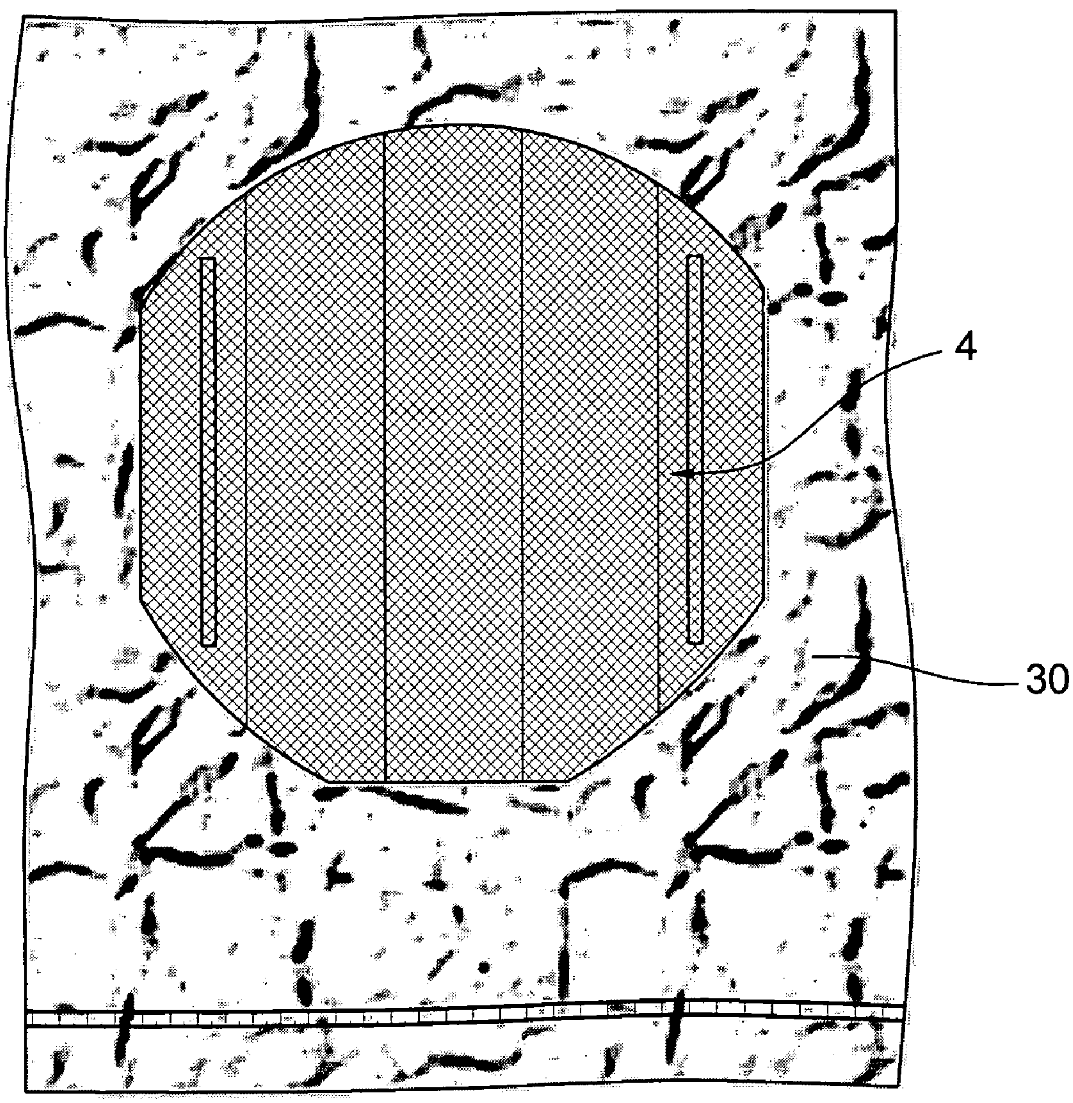
FIG. 6 is a view of the semiconductor board, on which there are glued the bands of amorphous metal placed in a bag in which a vacuum is created.

The semiconductor board 4, on which the bands 18 of amorphous magnetic material have been applied and maintained together by the adhesive mask 24 which is possibly covered by the above-mentioned protective film is placed in a bag under vacuum 30 (see FIG. 6). After having created the vacuum in the bag 30, the latter is hermetically sealed then returned to ambient atmospheric pressure. The atmospheric pressure then exerts a force which applies the film 22 of amorphous magnetic material on the semiconductor board 4. A retaining plate can also be placed on top of the protective film before bagging in order to avoid unsticking of the bands 18 during the application of the vacuum.

The polymerisation of the above-mentioned glue is effected in an oven at 60° C. for at least 48 hours.

When the gluing is finished, the semiconductor board 4 is removed from the bag 30 for applying the vacuum. The adhesive mask 24 is removed, then the plate 4 is dried and baked.

Of concern now, in conjunction with FIGS. 7A to 7G, are the photolithography steps which allow structuring of the film 22 of amorphous metal in order to form the magnetic cores of the magnetic sensors.

Figure 7A:
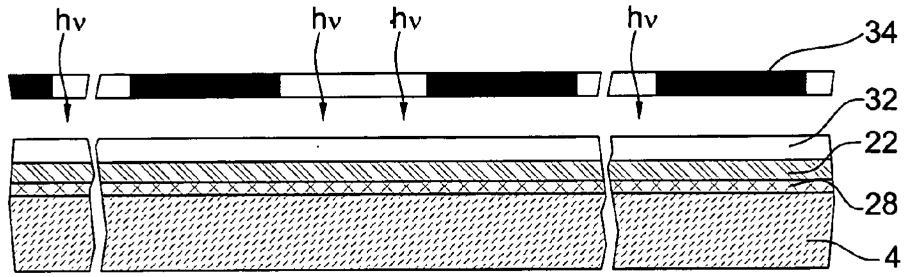
FIGS. 7A to 7G are basic diagrams illustrating the different steps for implementation of the method according to the present invention.
Figure 7B:
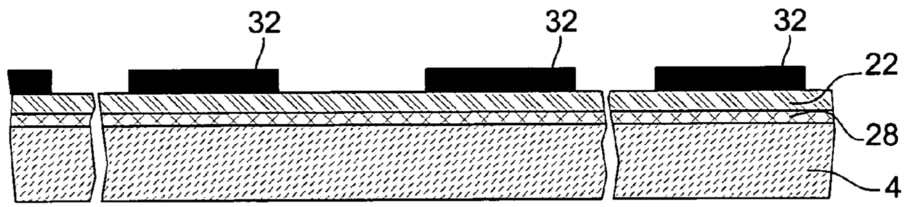

It commences firstly with depositing a layer 32 of positive photosensitive resin over all the surface of the film of amorphous metal 22 (FIG. 7A). The sensitisation of the photosensitive resin layer 32 is then implemented by means of an ultraviolet light passing through the transparent zones of a photoetching mask 34 which is suitably aligned with respect to the semiconductor board 4 and reproduces the zones to be sensitised. The layer of photosensitive resin 32 is then developed and finally only occupies the places where the magnetic cores 8 should be situated on the board 4 (FIG. 7B). A microscopic check allows it to be ensured that the development of the photosensitive resin 32 is effected appropriately.

Figure 7C:
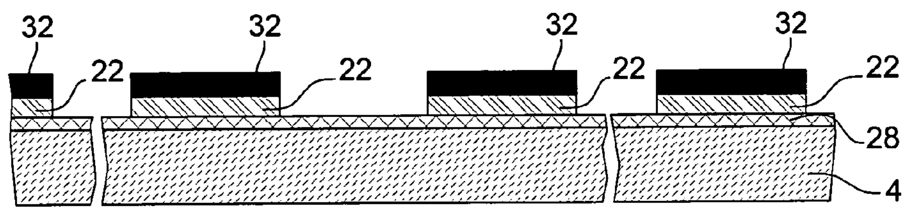

The following step of the method according to the invention comprises engraving the metallic film 22. To this end, a chemical engraving solution is sprayed over all the surface of the semiconductor board 4 in order to etch the amorphous metal wherever it is not protected by the layer of positive photosensitive resin 32 (FIG. 7C). During this step, the semiconductor board 4 is moved on a conveyor belt in a room where jets spray the etching solution on both faces of said board 4, which allows this etching solution to be renewed continuously and rapid and uniform etching to be ensured.

Figure 7D:
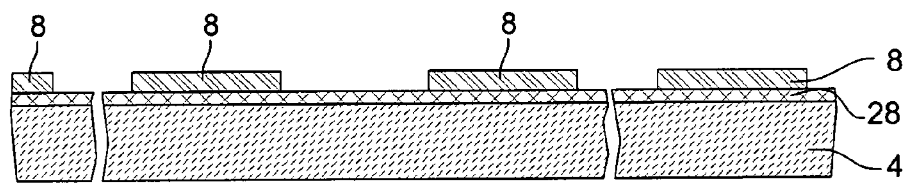

The etching lasts 1 min 30 to 2 min. It is terminated by rinsing the semiconductor board 4 with deionised water. The layer of photosensitive resin 32 which remains is then eliminated (FIG. 7D). The ferromagnetic cores 8 thus obtained can be observed with an electron microscope in order to verify their dimensions and also their surface condition.

Figure 7E:
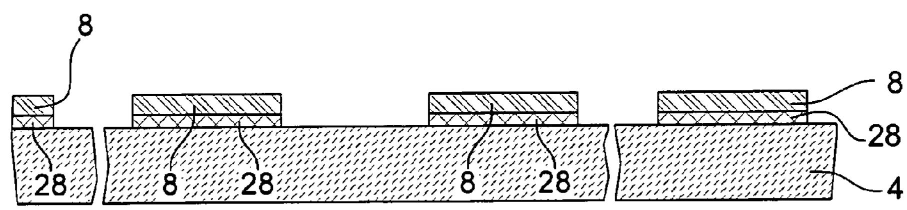

Of interest now is the step for eliminating the residual layer of glue 28 which will be described in conjunction with FIG. 7E.

In fact, the layer of glue 28 which covers all the semiconductor board 4 has resisted the above-described etching. It is therefore necessary to eliminate this layer of glue 28 in order to bare the zones for electrical connection of the sensors 1. To this end, the board 4 is subjected to a plasma etching in which the etching reactant is oxygen. The duration of the treatment is at least 240 minutes. The tests effected after the plasma etching show that the surface condition of the connection regions is such that the normal techniques for connecting these regions to the printed circuits on which the magnetic sensors 1 are intended to be fixed can be used.

Figure 7F:
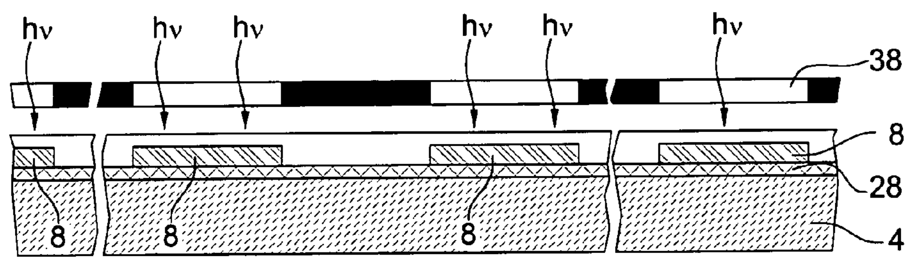

Finally, a thick layer 36 of negative photosensitive resin is deposited on top of the magnetic cores 8 in order that the latter cannot be damaged, or even become unstuck in the course of the following operations (FIG. 7F). The layer 36 of photosensitive resin must not however cover the connection zones of the magnetic sensor 1 in order that the latter can subsequently be connected to the printed circuit on which said sensor 1 will be mounted.

It will be understood that the residual layer of glue 28 must be eliminated before deposition of the negative resin layer 36, in the absence of which this resin layer 36 will adhere badly to the substrate.

Figure 7G:
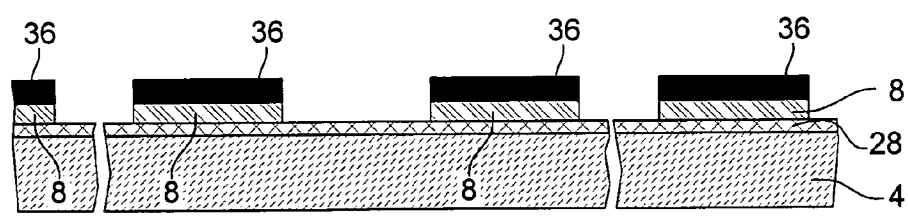

The negative photosensitive resin 36 is spread over the semiconductor board 4 by centrifugation, then exposed to light through a second photoetching mask 38 and finally developed (FIG. 7G). In this manner, a negative resin layer 36 of the order of a few tens of microns in thickness can be deposited on top of each core 8 in order to protect these cores 8 effectively.

Finally, the semiconductor board is sawn in order to provide a plurality of individual magnetic sensors 1 which are then stored in anti-static boxes.

The protection conferred by the resin layer 36 proves in particular to be useful during sawing of the semiconductor board 4, during manipulation of the individual magnetic sensors and in particular during their assembly on the final circuit.

It goes without saying that the present invention is not limited to the embodiment which has just been described and that various simple modifications and variants may be envisaged without departing from the scope of the present invention.

What is claimed is:

1. Method for producing in large numbers a multiplicity of magnetic sensors (1) produced on a semiconductor substrate (4), these sensors (1) comprising at least one magnetic core (8) produced in an amorphous magnetic material, characterised in that, after integration of the electronic circuits associated with the magnetic sensors (1), a film (22) of amorphous magnetic material is glued onto the semiconductor substrate (4), this film (22) being obtained from a band of amorphous magnetic material cut into a plurality of sections (18) which are disposed one beside the other on a support (20), said film being then structured in order to form the magnetic cores (8) of said magnetic sensors (1), the semiconductor substrate (4) being finally cut up in order to provide a plurality of individual magnetic sensors (1).

2. Method according to claim 1, characterised in that the support (20) is formed by a single face adhesive.

3. Method according to claim 1, characterised in that, before gluing, the film (22) of amorphous magnetic material is brought to the dimensions of the semiconductor substrate (4) on which it is intended to be glued.

4. Method according to claim 3, characterised in that, in order to give the film (22) of amorphous magnetic material a dimension corresponding to that of the semiconductor substrate (4), etching is effected through a mask (24) suitably configured so that only the regions of the film (22) which are not protected by the mask (24) will be engraved.

5. Method according to claim 1, characterised in that the film (22) of amorphous magnetic material is glued under vacuum on the semiconductor substrate (4).

6. Method according to claim 5, characterised in that the film (22) of amorphous magnetic material is positioned with respect to the semiconductor substrate (4), then deposited on the surface (2) of the latter, the entirety then being placed in a bag (30) in which a vacuum is created and which is then hermetically sealed before being restored to ambient atmospheric pressure, the atmospheric pressure then exercising a force which applies the film (22) of amorphous magnetic material on the semiconductor substrate (4).

7. Method according to claim 6, characterised in that, before bagging, a protective film is disposed on top of the film (22) of amorphous magnetic material in order to avoid possible penetrations of the glue (28).

8. Method according to claim 1, characterised in that, after gluing, a layer of positive photosensitive resin (32) is deposited on the film (22) of amorphous magnetic material, then insolated through a photoetching mask (34), the photosensitive resin (32) being then developed and finally occupying only the sites of the semiconductor substrate (4) where the magnetic cores (8) should be situated.

9. Method according to claim 8, characterised in that a chemical etching solution is sprayed over all the surface of the semiconductor substrate (4) in order to eliminate the amorphous magnetic material (22) wherever it is not protected by the layer of photosensitive resin (32).

10. Method according to claim 9, characterised in that, after engraving, a layer of negative photosensitive resin (36) is deposited on the semiconductor substrate (4) then insolated through a photoetching mask (38), the photosensitive resin (36) being then developed and only remaining on top of the magnetic cores (8) which it protects.

11. Method according to claim 10, characterised in that the glue (28) which still covers all the surface (2) of the semiconductor substrate (4) is eliminated by plasma etching.

12. Method according to claim 1, characterised in that, after preparation, the glue (28) used to glue the film (22) of amorphous magnetic material onto the semiconductor substrate (4) is degassed then spread over said semiconductor substrate (4) by centrifugation.

13. Method according to claim 12, characterised in that the glue (28) is a glue of the epoxy type, to which an adhesive promoter may be added.

14. Method according to claim 1, characterised in that, before gluing the film (22) of amorphous magnetic material, the semiconductor substrate (4) is firstly cleaned, then placed in an oven in order to evaporate the residual humidity, which improves adhesion.

15. Method according to claim 1, characterised in that the band of semiconductor material is thinned by grinding, then subjected to etching in order to dissolve a small quantity of the metal on each side of the band in order to eliminate mechanical stresses produced on the surface by the grinding.

16. Method according to claim 15, characterised in that the mask (24) used to effect the etching which will bring the film (22) of amorphous magnetic material to the dimensions of the semiconductor substrate (4) is glued on the free face of said film (22).

17. Method according to claim 16, characterised in that the adhesive support (20) is removed after etching, the bands (18) being cleaned and dried on that side which is not protected and the adhesive (24) being used as a mask remains in place in order subsequently to be used for protection during gluing of the film (22) of amorphous magnetic material on the semiconductor substrate (4).

18. Method for producing in large numbers a multiplicity of magnetic sensors produced on a semiconductor substrate, these sensors comprising at least one magnetic core produced in an amorphous magnetic material, wherein a film of amorphous magnetic material is glued onto the semiconductor substrate, this film being obtained from a band of amorphous magnetic material cut into a plurality of sections which are disposed one beside the other on a support, said film being then structured in order to form the magnetic cores of said magnetic sensors, the semiconductor substrate being finally cut up in order to provide a plurality of individual magnetic sensors.

19. Method according to claim 18, wherein the support is formed by a single face adhesive.

20. Method according to claim 18, wherein, before gluing, the film of amorphous magnetic material is brought to the dimensions of the semiconductor substrate on which it is intended to be glued.

21. Method according to claim 20, wherein, in order to give the film of amorphous magnetic material a dimension corresponding to that of the semiconductor substrate, etching is effected through a mask suitably configured so that only the regions of the film which are not protected by the mask will be engraved.

22. Method according to claim 18, wherein the film of amorphous magnetic material is glued under vacuum on the semiconductor substrate.

23. Method according to claim 22, wherein the film of amorphous magnetic material is positioned with respect to the semiconductor substrate, then deposited on the surface of the latter, the entirety then being placed in a bag in which a vacuum is created and which is then hermetically sealed before being restored to ambient atmospheric pressure, the atmospheric pressure then exercising a force which applies the film of amorphous magnetic material on the semiconductor substrate.

24. Method according to claim 18, wherein, after preparation, a glue used to glue the film of amorphous magnetic material onto the semiconductor substrate is degassed then spread over said semiconductor sustrate by centrifugation.

25. Method according to claim 18, wherein a layer of negative photosensitive resin is deposited on the semiconductor substrate then insolated through a photoetching mask, the photosensitive resin being then developed and only remaining on top of the magnetic cores which it protects.

26. Method according to claim 25, wherein, before bagging, a protective film is disposed on top of the film of amorphous magnetic material in order to avoid possible penetrations of the glue.

27. Method according to claim 24, wherein the glue is a glue of the epoxy type, to which an adhesive promoter may be added.

28. Method according to claim 18, wherein, before gluing the film of amorphous magnetic material, the semiconductor substrate is firstly cleaned, then placed in an oven in order to evaporate the residual humidity, which improves adhesion.

29. Method according to claim 21, wherein the mask used to effect the etching which will bring the film of amorphous magnetic material to the dimensions of the semiconductor substrate is glued on the free face of said film.

30. Method according to claim 29, wherein the adhesive support is removed after etching, the bands being cleaned and dried on that side which is not protected and the adhesive being used as a mask remains in place in order subsequently to be used for protection during gluing of the film of amorphous magnetic material on the semiconductor substrate.

* * * * *